US005751092A

United States Patent [19]
Abe

[11] Patent Number: 5,751,092
[45] Date of Patent: May 12, 1998

[54] PIEZOELECTRIC TRANSFORMER AND POWER CONVERTING APPARATUS EMPLOYING THE SAME

[75] Inventor: Tooru Abe, Saitama, Japan

[73] Assignee: Hitachi Metals, Ltd., Tokyo, Japan

[21] Appl. No.: 675,880

[22] Filed: Jul. 5, 1996

[30] Foreign Application Priority Data

Jul. 6, 1995 [JP] Japan ................... 7-170662
Mar. 27, 1996 [JP] Japan ................... 8-071838

[51] Int. Cl.$^6$ .................................. H01L 41/08
[52] U.S. Cl. .................. 310/359; 310/316; 310/366
[58] Field of Search ........................ 310/316, 317, 310/358, 359, 366, 328

[56] References Cited

U.S. PATENT DOCUMENTS

| | | | |
|---|---|---|---|
| 2,830,274 | 4/1958 | Rosen et al. | 310/359 |
| 2,974,296 | 3/1961 | Rosen | 310/359 |
| 2,975,354 | 3/1961 | Rosen | 310/359 |
| 3,562,792 | 2/1971 | Berlincourt et al. | 310/359 |
| 3,707,636 | 12/1972 | Inoue | 310/359 X |
| 5,329,200 | 7/1994 | Zaitsu | 310/316 |
| 5,341,061 | 8/1994 | Zaitsu | 310/366 X |
| 5,504,384 | 4/1996 | Lee et al. | 310/359 |

FOREIGN PATENT DOCUMENTS

7-74405   3/1995   Japan .

*Primary Examiner*—Mark O. Budd
*Attorney, Agent, or Firm*—Finnegan, Henderson, Farabow, Garrett & Dunner, L.L.P.

[57] ABSTRACT

A piezoelectric transformer has a driving section area which is provided with input electrodes at the central portion of a long-plate-shaped piezoelectric element and which is polarized in the direction of the thickness thereof; and power generating section areas which are provided with output electrodes on the ends surfaces in the direction of the length thereof, which are polarized in the opposite directions from each other with the driving section area between them, and which are disposed on both ends of the piezoelectric element. The piezoelectric transformer is excited in the half wavelength mode to obtain an output between the output electrodes and the input electrodes. A ratio L2/L1 of the length L2 of the driving section to the overall length L1 in the direction of the length of the piezoelectric transformer ranges from 0.3 to 0.6.

5 Claims, 12 Drawing Sheets

λ/2 MODE    λ MODE

PIEZOELECTRIC TRANSFORMER AND POWER CONVERTING APPARATUS EMPLOYING THE SAME

BACKGROUND OF THE INVENTION

1. Field of the Invention

The present invention relates to a piezoelectric transformer used for a power converting apparatus such as a DC-DC converter and a backlight inverter for a liquid crystal display or the like, and a power converting apparatus employing the same.

2. Description of the Related Art

Most liquid crystal displays do not emit light by themselves and therefore, backlit type is currently the mainstream in which a discharge tube such as a cold-cathode tube is disposed at the rear or side of the liquid crystal display unit.

Driving such a discharge tube requires high AC voltage of at least a few hundred volts although the required AC voltage depends on the length or diameter of the discharge tube. A discharge tube and an operating apparatus which employ a piezoelectric transformer in order to generate the high AC voltage have been proposed in Japanese Patent Laid-Open No. 52-113578. A piezoelectric transformer is significantly simpler in structure than a transformer using windings and it permits reduction in size, thickness, and cost. The principle and characteristics of the piezoelectric transformer are shown in "The characteristics and applications of piezoelectric transformers" in the July issue, 1971 of "Electronic Ceramics" which is a technical journal published by Gakkensha.

Figure 14:
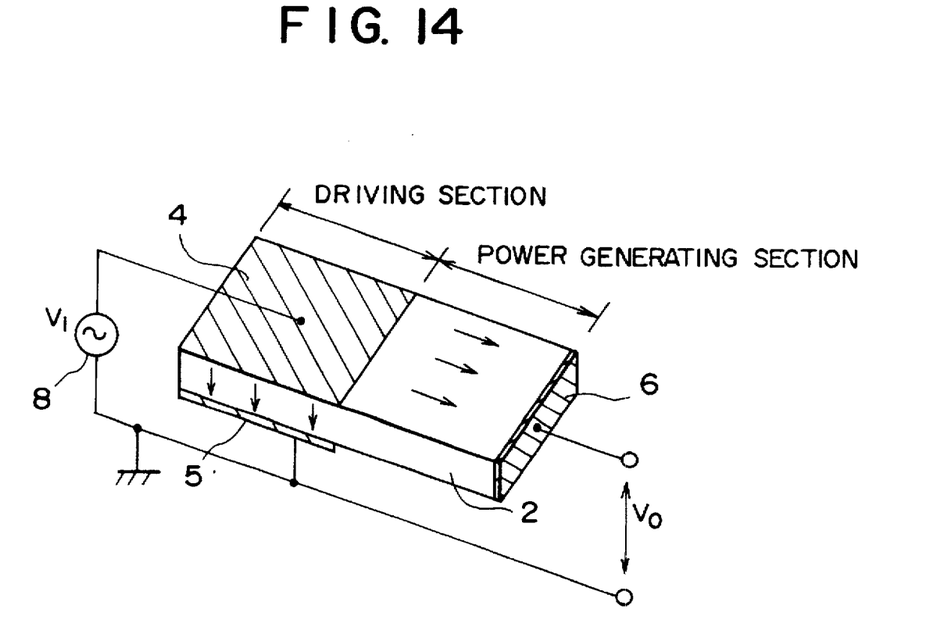
FIG. 14 is an explanatory diagram showing the principle of the operation of a conventional piezoelectric transformer.

FIG. 14 shows, as an example of piezoelectric transformer, a Rosen piezoelectric transformer announced by C. A. Rosen in the United States in 1956. The structure of the Rosen piezoelectric transformer will be described with reference to FIG. 14. The Rosen piezoelectric transformer includes a plate-shaped piezoelectric ceramic element 2 composed of, for example, a lead-zirconate-titanate (PZT) type material, a pair of input electrodes 4 and 5 which are provided by silver baking, for example, on the top and bottom surfaces of the left half of the ceramic element 2 in the figure, and an output electrode 6 formed by a similar method on the right end surface thereof. A driving section of the left half of the ceramic element 2 is polarized in the direction of the thickness thereof while a power generating section of the right half thereof is polarized lengthwise.

Figure 15:
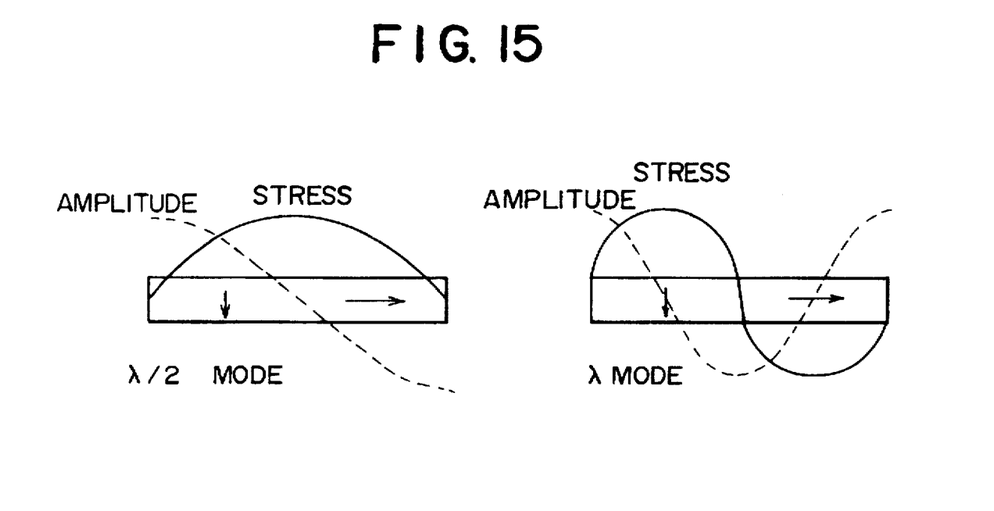
FIG. 15 is an explanatory diagram showing a vibration mode of a piezoelectric transformer.

In the piezoelectric transformer configured as described above, when an AC voltage, which has an approximately identical frequency to the mechanical resonance frequency in the direction of the length of the ceramic element 2, is applied through an AC voltage generator 8 across the input electrodes 4 and 5, the ceramic element 2 produces intense mechanical vibration in the direction of the length thereof and the power generating section of the right half generates electric charges due to the piezoelectric effect. This causes an output voltage Vo to appear between the output electrode 6 and the input electrode 5 which is one of the two input electrodes. As shown in FIG. 15, the vibration mode basically comes in a half wavelength mode ($\lambda/2$ mode in the figure), wherein the resonance occurs in the direction of the length in half wavelength, and a full wavelength mode ($\lambda$ mode in the figure) wherein the resonance occurs in one wavelength.

With the increasing trend toward smaller office automation equipment, the piezoelectric transformers are becoming smaller and thinner accordingly. The external dimensions of piezoelectric transformers are inversely proportional to exciting frequency; therefore, it is required to set the exciting frequency as high as possible to make smaller piezoelectric transformers. An excessively high frequency, however, causes high-frequency currents to flow into the metallic portions of an equipment main body through stray capacity from a discharge tube, wiring, or the like in the backlight system, for example, used in a liquid crystal display unit, thus preventing sufficient tube currents to be supplied to the discharge tube. Since the stray capacity exerts significant influences in the discharge tube driven at high frequency and high voltage, the exciting frequency must be set as low as possible. If the same length of a piezoelectric transformer element is used, then the resonance frequency of a piezoelectric transformer element of the half wavelength mode is half that of the full wavelength mode. This means that exciting the piezoelectric transformer element in the half wavelength mode makes it possible to lower the required frequency. Nevertheless, the aforesaid Rosen piezoelectric transformers often employ the full wavelength mode which enables a higher boosting ratio, whereas the half wavelength mode fails to provide sufficiently high boosting ratio in actual applications.

The aforesaid Rosen piezoelectric transformers have the problems set forth below.

Figure 11:
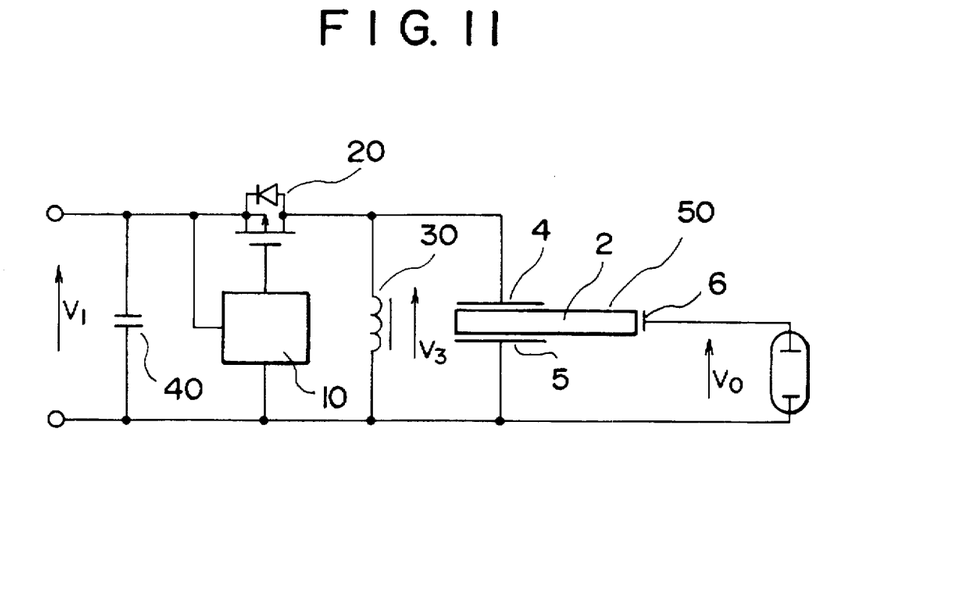
FIG. 11 is a circuit diagram illustrative of an example of a conventional power converting device which employs a piezoelectric transformer.
Figure 12:
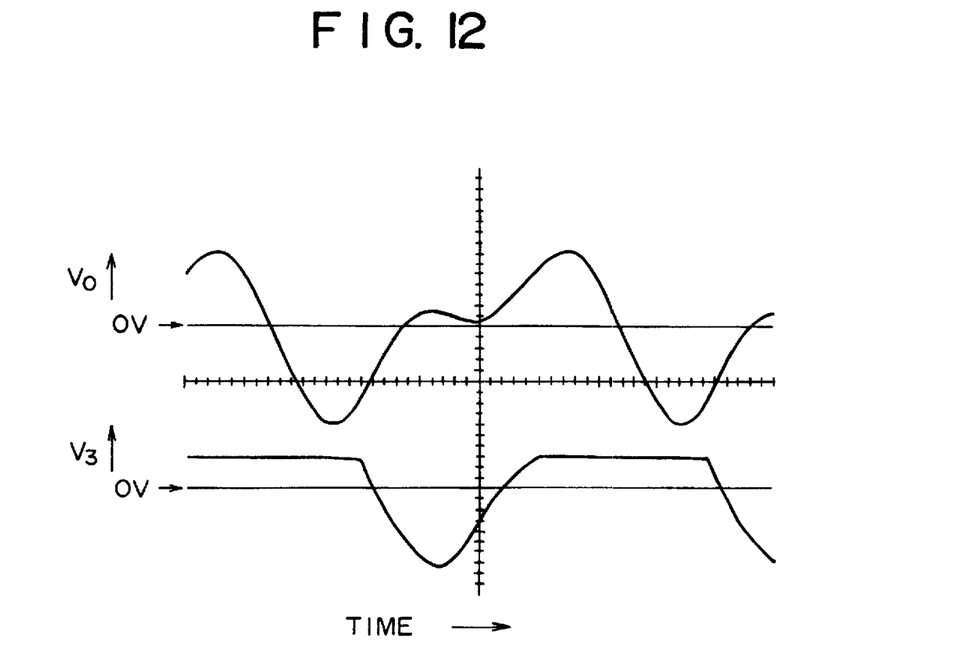
FIG. 12 is a waveform diagram showing an output voltage V0 and an exciting voltage V3 of the piezoelectric transformer in the circuit shown in FIG. 11.
Figure 13:
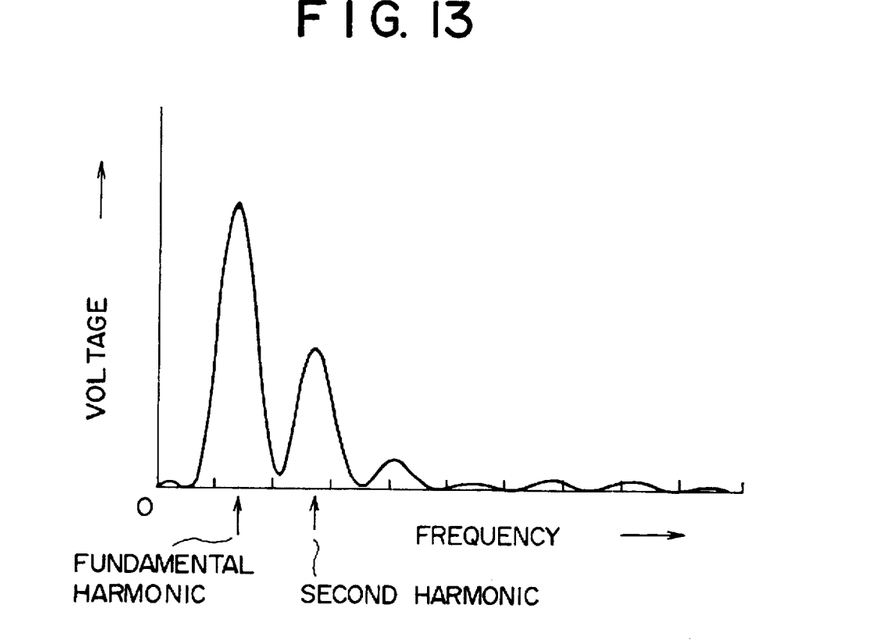
FIG. 13 is a diagram showing the result of the Fourier analysis of the exciting voltage V3 of the circuit shown In FIG. 11.

FIG. 11 shows a typical power converting circuit which employs the Rosen piezoelectric transformer illustrated in FIG. 14. FIG. 12 shows the waveforms of the output voltage V0 and exciting voltage V3 of a piezoelectric transformer 50 of the circuit. The exciting voltage V3 of the piezoelectric transformer 50 appears as a sinusoidal half wave as shown in FIG. 12 owing to the resonance caused by the inductance of an inductor 30, the output capacitance of a MOSFET 20, and the input capacitance of the piezoelectric transformer 50, thus leading to a reduced switching loss of a MOSFET 21. The result of the Fourier analysis of the exciting voltage V3 shown in FIG. 13 indicates that the exciting voltage V3 includes a relatively high percentage of second harmonic with respect to the fundamental harmonic; therefore, the piezoelectric transformer 50 is excited by the two frequency components, namely, the fundamental harmonic and the second harmonic. In this case, if the exciting frequency is nearly equal to the half wavelength mode resonance frequency of the piezoelectric transformer 50, then the second harmonic of exciting voltage V3 is nearly equal to the full wavelength mode resonance frequency. This means that two different vibration modes are present in the piezoelectric transformer 50, resulting in a distorted waveform of the output voltage V0 of the piezoelectric transformer 50 as shown in FIG. 12 because of the presence of the two vibration modes mixed.

As described on page 49 of the June, 1994 issue of a technical journal titled "Electronics Technology" published by Nikkan Kogyo Shimbunsha, the cold-cathode tube used for backlighting a liquid crystal display unit is known to have a shorter service life if it is driven on waveforms which are significantly distorted. Thus, the output voltage which has the distorted waveform as discussed above presented a problem.

The Rosen piezoelectric transformer has another problem in that residual stress occurs at the central portion thereof because the amplitude reaches its maximum value at the center.

As previously mentioned, to make smaller piezoelectric transformer elements, it is necessary to drive in the half wavelength mode. Driving on the distorted waves in the half wavelength mode, however, poses the problem of a distorted output due to the coexistence of the two vibration modes since the second harmonic corresponds to the full wavelength mode.

Figure 19:
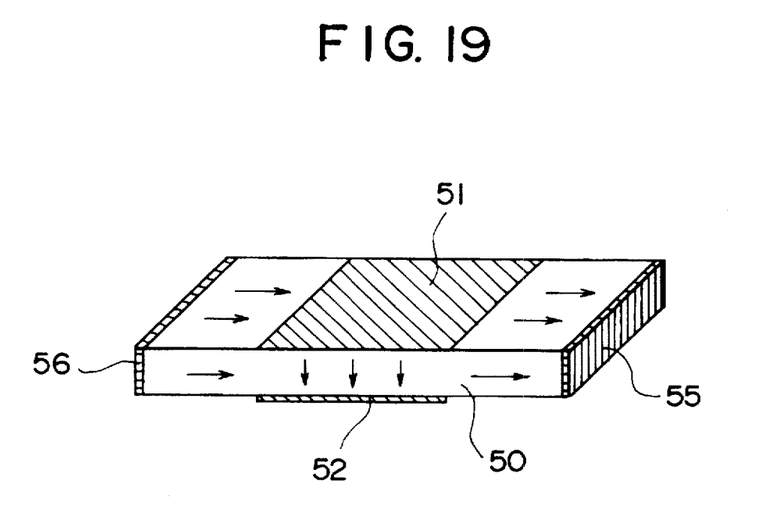
FIG. 19 is an explanatory diagram illustrative of the structure of the conventional piezoelectric transformer.

A center-drive type piezoelectric transformer is known to be a piezoelectric transformer which does not have the full wavelength mode. FIG. 19 shows the structure of the center-drive type piezoelectric transformer element which has a driving section polarized in the direction of thickness at the central part thereof and which has power generating sections polarized in one direction of the length thereof on both sides of the driving section. The piezoelectric transformer element of this type features a simple structure and a high output impedance and it does not have the full wavelength mode, thus making it advantageous in that it hardly produces distorted waves.

This type of piezoelectric transformer elements, however, exhibits low efficiency, depending on load impedance. When the capacitances on both sides of the central input electrode at the central part of the piezoelectric transformer having the structure illustrated in FIG. 19 are denoted as C2, the impedance from the output side of the piezoelectric transformer is expressed as $1/(2\pi f \cdot (C2/2))$. Thus, it can be seen that the efficiency is high when the load impedance is relatively high, while the efficiency is low when the load impedance is relatively low.

Figure 20:
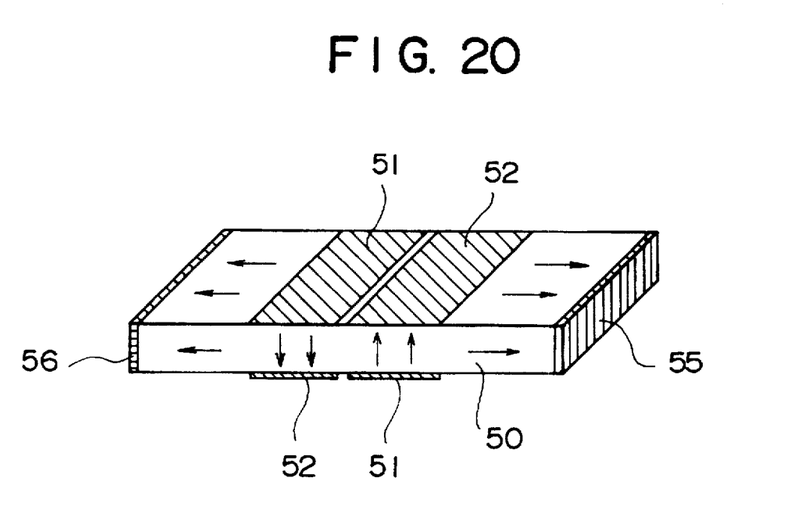
FIG. 20 is an explanatory diagram illustrative of the structure of another conventional piezoelectric transformer.

Japanese Patent Laid-Open No. 7-74405 has proposed a center-drive type piezoelectric transformer element which can be driven in multiple modes including the half wavelength mode and the full wavelength mode. The piezoelectric transformer element is illustrated in FIG. 20; it has two driving sections which are polarized in the opposite directions in the direction of thickness at the central part thereof and it also has power generating sections, which are polarized in the lengthwise direction toward both ends and which are provided on both sides of the driving sections. This center-drive type piezoelectric transformer does not provide a high boosting ratio or high adaptive impedance, but it provides higher efficiency than the aforesaid center-drive type piezoelectric transformer; however, it is disadvantageous in that the driving sections are polarized in opposite directions, leading to a complicated structure which leads to higher cost and also in that the unpolarized portion between the two central driving sections tends to develop a high residual stress and becomes easily damageable since the two driving sections are polarized in the opposite directions.

There is still another problem. As described above, the conventional piezoelectric transformer has two practical vibration modes; therefore, if the exciting voltage of the frequency corresponding to the half wavelength mode includes a high percentage of second harmonic component, then the two vibration modes, namely, the half wavelength mode and the full wavelength mode, coexist in the piezoelectric transformer and the output voltage thereof accordingly exhibits distorted waves which contain both components, leading to a shortened service life of the load which employs the piezoelectric transformer.

SUMMARY OF THE INVENTION

The present invention has been made with a view toward solving the problems described above.

It is an object of the invention to provide an inexpensive piezoelectric transformer element which provides a high boosting ratio and high efficiency and which is driven in a half wavelength mode with no full wavelength mode.

It is another object of the invention to provide a piezoelectric transformer comprising: a long-plate-shaped piezoelectric element having a driving section area which is equipped with input electrodes at the central part thereof and which is polarized in the direction of thickness; and power generating section areas which have output electrodes provided on both end surfaces in the direction of the length thereof and which are polarized in the opposite directions from each other in the direction of the length thereof with the driving section area located between them, thereby supplying an output between the output electrodes and the input electrodes. The piezoelectric transformer is excited in the half wavelength mode and a ratio L2/L1 of a length L2 of the driving section to an overall length L1 of the piezoelectric transformer ranges from 0.3 to 0.6

In the piezoelectric transformer according to the present invention, since the input electrode is provided so that the length thereof is in the ratio of 0.3 to 0.6 in relation to the entire length at the central part which develops high stress in the half wavelength mode, the boosting ratio is greater than that obtained in the half wavelength mode of the conventional piezoelectric transformer. Furthermore, the power generating sections, which are polarized in the opposite directions with the driving section located between them, make the piezoelectric transformer laterally symmetrical at the center thereof, so that the electric charges are offset in the full wavelength mode, preventing the piezoelectric transformer from vibrating. Hence, even when the exciting voltage of the frequency which corresponds to the half wavelength mode contains the second harmonic component, the piezoelectric transformer vibrates only in the half wavelength mode; therefore, the output voltage has a sinusoidal waveform of the exciting frequency.

When the capacitances at both ends with the driving section between them are denoted as C2, the impedance from the output side of the piezoelectric transformer is expressed as $1/(2\pi f \cdot 2C2)$. This indicates that the efficiency is high when a connected load impedance is relatively low.

Moreover, when the length of the piezoelectric element is denoted as L1 and the width thereof as W, if the ratio of L1/W stays in the range of 4.10 to 4.77, then the vibration of the piezoelectric element in the direction of the length thereof does not combine with the vibration in the direction of the width thereof, making it possible to efficiently take out the output.

DETAILED DESCRIPTION OF THE PREFERRED EMBODIMENTS

[First Embodiment]

Figure 1:
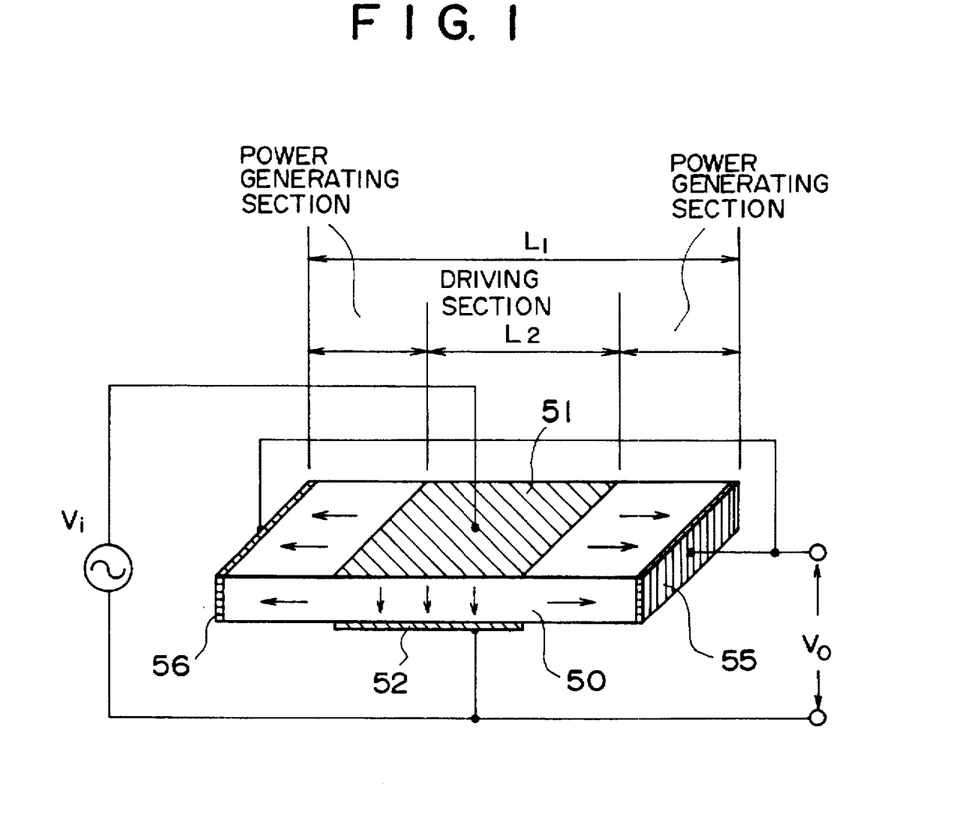
FIG. 1 is an explanatory diagram which shows the principle of the operation of a piezoelectric transformer according to the invention.

The embodiments of the present invention will now be described with reference to the accompanying drawings FIG. 1 is an explanatory diagram of an embodiment of the piezoelectric transformer in accordance with the present invention. The piezoelectric transformer of the invention differs from a conventional piezoelectric transformer in that a driving section equipped with input electrodes 51 and 52 is provided at the central part in the direction of the length of a piezoelectric element and that output electrodes 55 and 56 are provided on both end surfaces; it also differs in that the driving section is polarized in the direction of the thickness thereof and power generating sections are polarized in the opposite directions from each other in the direction of the length thereof with the driving section between them.

Figure 2:
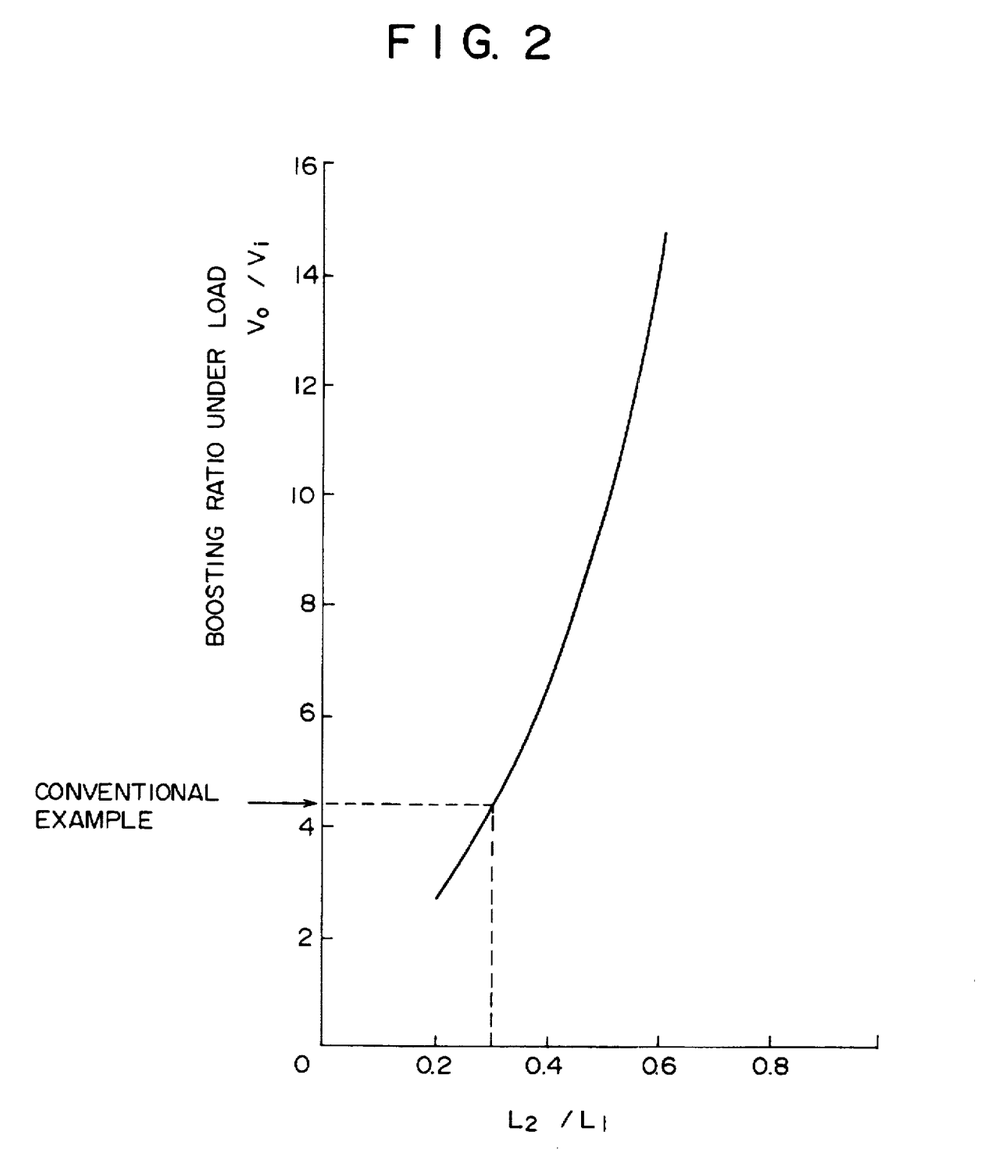
FIG. 2 shows a characteristic curve illustrative of the boosting ratio of the piezoelectric transformer according to the invention under load.
Figure 3:
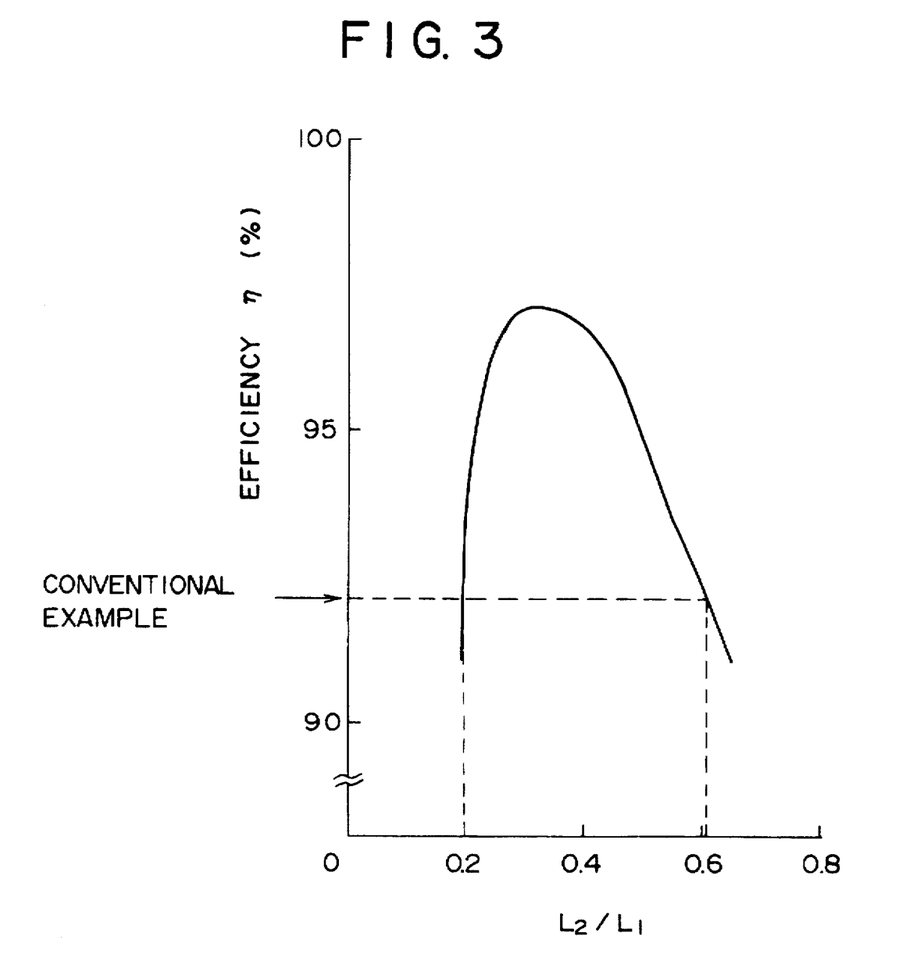
FIG. 3 shows a characteristic curve illustrative of the efficiency of the piezoelectric transformer according to the invention.

When the entire length in the lengthwise direction is denoted as L1 and the length of the driving section as L2, the dependency of a boosting ratio of Vo/Vi on L2/L1 under load of a center-drive type piezoelectric transformer in the half wavelength mode is as shown in FIG. 2; the dependency of efficiency η on L2/L1 is shown in FIG. 3. In this case, the load resistance is 100 kΩ and the load current is 5 mA. The boosting ratio of the conventional piezoelectric transformer under load in the half wavelength mode shown in FIG. 14 is 4.4 and the efficiency is 92.1%; therefore, the boosting ratio under load is higher than that of the conventional piezoelectric transformer in the range where L2/L1 is 0.3 or more and the efficiency is higher than that of the conventional piezoelectric transformer in the range where L2/L1 is 0.3 to 0.6. Thus, it can be seen that the piezoelectric transformer in accordance with the invention provides higher efficiency and higher boosting ratio than the conventional piezoelectric transformer in the range where L2/L1 is 0.3 to 0.6. The piezoelectric transformer according to the invention also enables outputs to be obtained at high efficiency of 95% or more in the range of 0.3 to 0.45. Exactly the same effects are obtained even when the power generating sections are polarized toward the central part from the ends.

Figure 4:
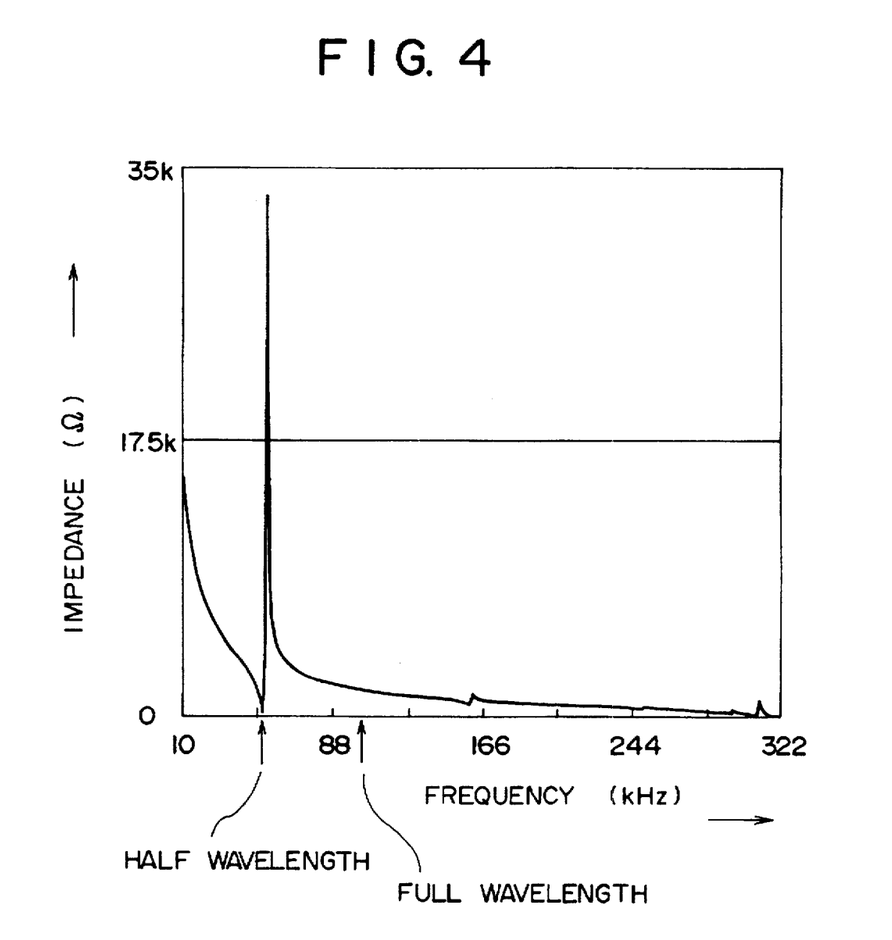
FIG. 4 is a frequency characteristic chart of the impedance measured from the input side of the piezoelectric transformer according to the invention.

FIG. 4 shows a frequency characteristic of the impedance measured from the input electrodes of the piezoelectric transformer of the invention. The figure indicates that resonance takes place at around 50 kHz which corresponds to the half wavelength mode, while resonance is hardly observed at around 100 kHz which corresponds to the full wavelength mode. The reason for this will be described below.

When the piezoelectric transformer of the invention is observed widthwise, it is laterally symmetrical with respect to the center of the driving section. As shown in FIG. 15, the direction of the stress on the right side is opposite from that on the left side in the full wavelength mode and therefore, the electric charges generated due to the stress in this mode are offset in the driving section and the power generating sections. Thus, since the electric charges which are partly responsible for the piezoelectric phenomenon are offset and do not appear, the resonance characteristic is not observed in this mode and hence no transformation is performed.

[Second Embodiment]

Figure 5:
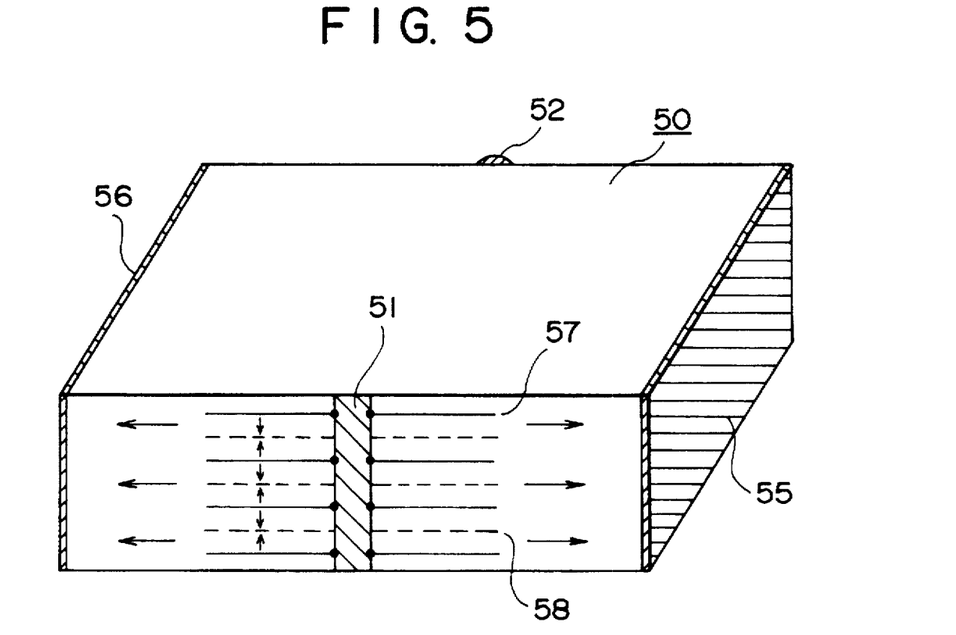
FIG. 5 is a diagram showing another embodiment of the piezoelectric transformer according to the invention.
Figure 6:
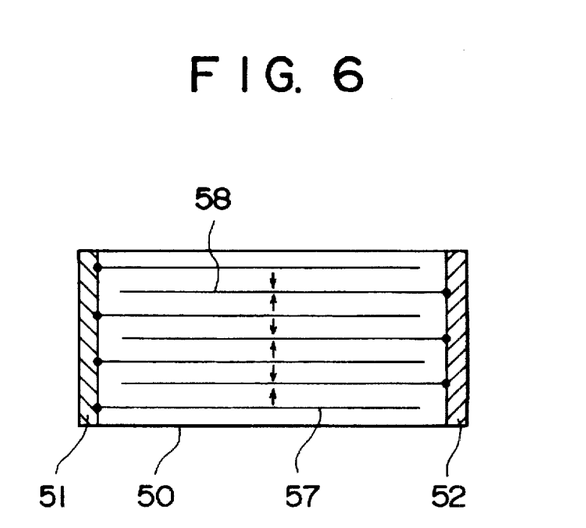
FIG. 6 is a sectional view of another embodiment of the piezoelectric transformer according to the invention.

The following describes another embodiment of the piezoelectric transformer according to the invention which is capable of lighting a discharge tube 60 such as a cold-cathode tube from a battery or other low-voltage input source. This embodiment is a laminated piezoelectric transformer which has a driving section of a laminated design; FIG. 5 shows an explanatory diagram thereof and FIG. 6 shows a sectional view thereof. Input voltage Vi is applied to the respective laminated thin layers of the driving section of the piezoelectric transformer, thus increasing the boosting ratio by approximately the number of the laminated layers in comparison with a single-layer type. To fabricate the laminated piezoelectric transformer, a PZT-based ceramic green sheet is produced by using the doctor blade process, then internal electrodes 57 and 58 are formed on a part of the green sheet by using the screen printing. The green sheets thus produced are laminated, contact-bonded, and sintered. The sintered laminated unit is cut and ground before it is provided with the input external electrodes 51 and 52 and the output electrodes 55 and 56 by silver baking. Then, an internal electrode 57 is connected to the external electrode 51 and the internal electrode 58 is connected to the external electrode 52. In the last step, the driving section is polarized in the direction of the thickness thereof and the power generating sections are polarized in the direction of the length thereof. The laminated piezoelectric transformer thus completed is 20.4 mm long, 4.6 mm wide, and 1.2 mm thick and it is comprised of fifteen layers. In the half wavelength mode, the amplitude of the vibration is minimum at the center of the piezoelectric element in the direction of the length thereof. Hence, the reliability of the leader lines connected to the external electrode can be improved by providing the external electrode at the aforesaid center. In this case, the leader lines are drawn out from a side surface of the piezoelectric transformer. The extreme top and bottom layers of the driving section form dummy layers because they are not polarized; however, the dummy layers may be eliminated by providing the top and bottom surfaces with electrodes and connecting them with the external electrodes 52 and 51, respectively.

[Third Embodiment]

Figure 7:
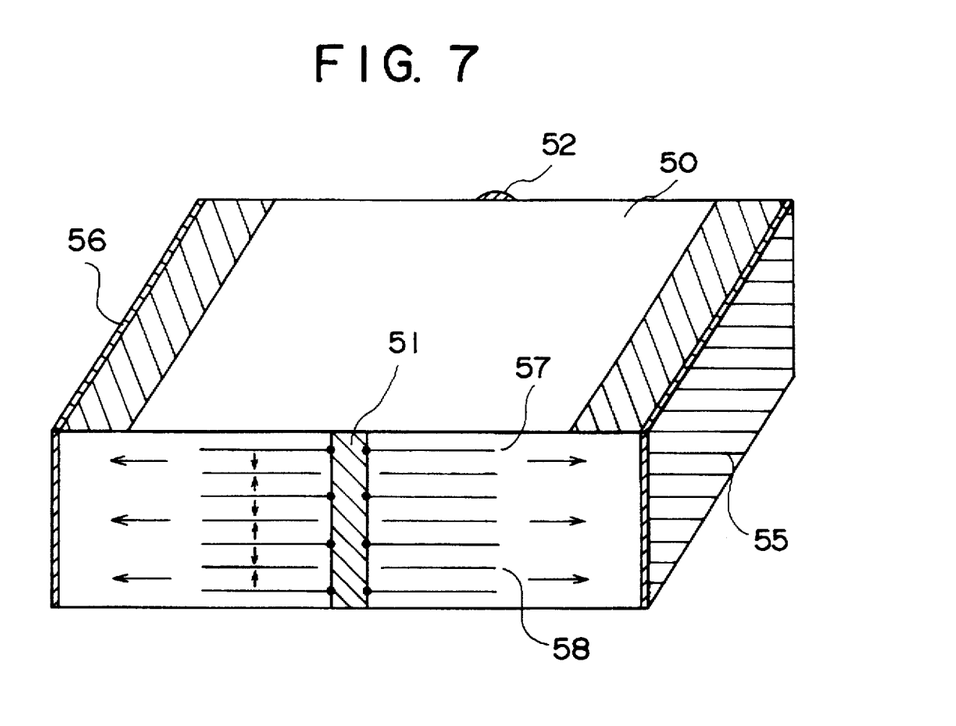
FIG. 7 is a diagram showing still another embodiment of the piezoelectric transformer according to the invention.
Figure 8:
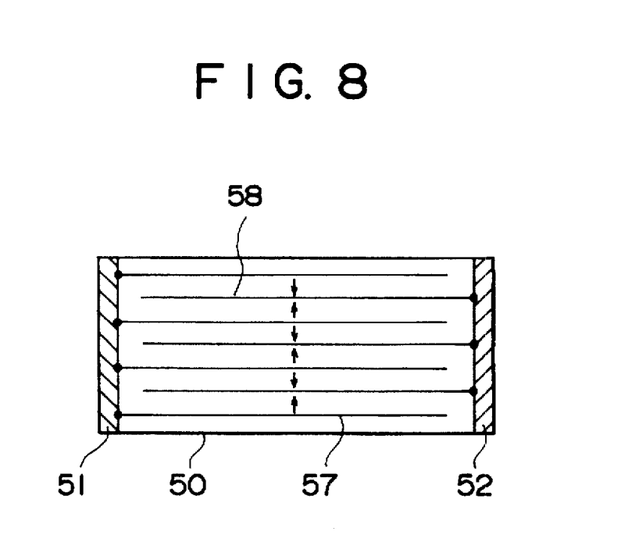
FIG. 8 is a sectional view of still another embodiment of the piezoelectric transformer according to the invention.

FIG. 7 is an explanatory drawing of another embodiment of the laminated piezoelectric transformer according to the present invention; and FIG. 8 is a sectional view of the portion where the external electrode 51 is formed. In the driving section of the laminated piezoelectric transformer shown in FIG. 5 and FIG. 6, the internal electrode 57 and the internal electrode 58 are shifted widthwise so as to prevent the contact between the internal electrode 58 and the external electrode 51. The third embodiment is designed to maximize the size of the internal electrodes 57 and 58 so as to improve the characteristics thereof, the internal electrode 58 being disposed away from the external electrode 51 so that it does not come in contact with the external electrode 51. Likewise, the internal electrode 57 is disposed away from the external electrode 52. The resulting configuration of the piezoelectric transformer is similar to that of the second embodiment. The output electrodes 55 and 56 extend from the bottom surface up to the top surface of the piezoelectric transformer. Thus, attaching a lead wire to the portion, where the output electrodes are provided, eliminates the need for attaching the lead wires from the output electrodes to the end surfaces where maximum vibration occurs. This provides an advantage in that the vibration of the piezoelectric transformer caused by an attached lead wire can be controlled and the chance of the breakage of the lead wire attaching portion due to vibration can be minimized.

Figure 9:
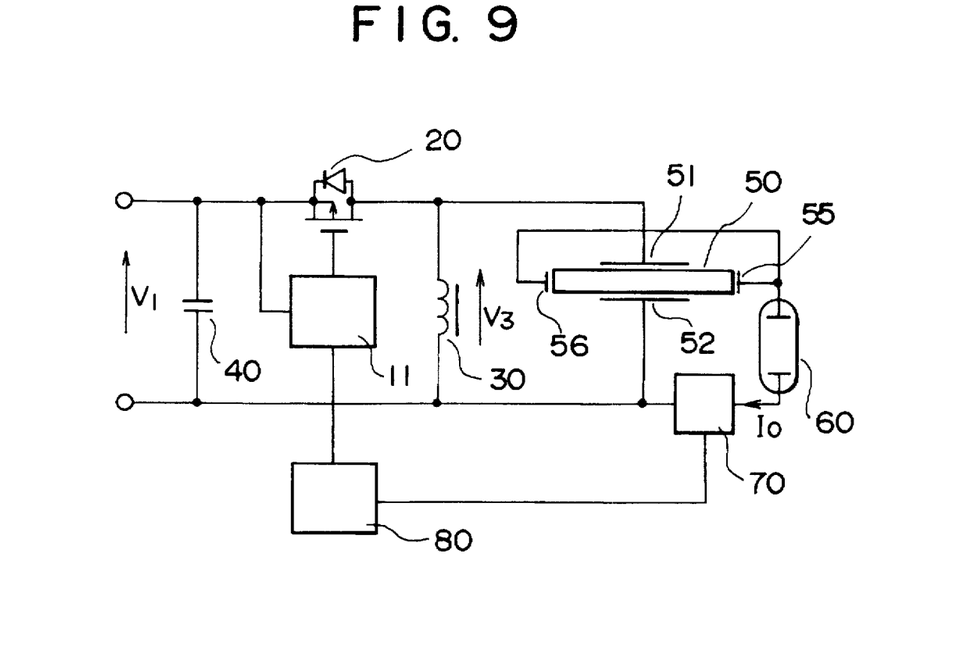
FIG. 9 is a circuit diagram showing an embodiment of a power converting circuit according to the invention which regulates the driving frequency to control the output.
Figure 17:
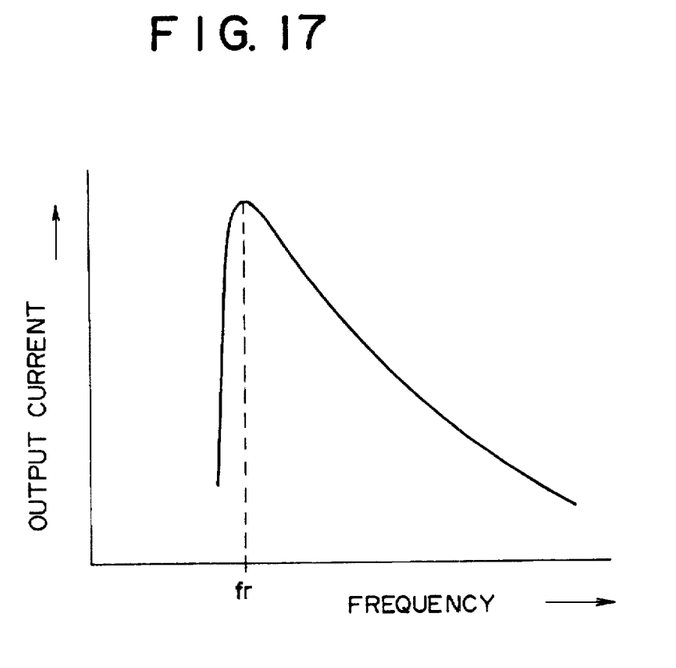
FIG. 17 is a frequency characteristic diagram of the output currents of the piezoelectric transformer when a cold-cathode tube thereof is under load.

A liquid crystal display backlight is required to permit the adjustment of the brightness of the display surface by controlling the currents flowing into the discharge tube 60. A method currently available for controlling the output of a piezoelectric transformer makes use of the frequency characteristic of the piezoelectric transformer. FIG. 17 shows the frequency characteristics of the output currents of the piezoelectric transformer when the cold-cathode tube is under load. As it can be seen from the figure, the piezoelectric transformer has the resonance characteristic, making it possible to control the output by the frequency near the resonance frequency fr. When the cold-cathode tube is under load, the right side, i.e. the low-frequency side, is asymmetrical to the right side, i.e. the high-frequency side; this embodiment uses the high-frequency side wherein the gradient is gentler. FIG. 9 is a circuit diagram illustrative of an embodiment of the power converting device adapted to control the output of the piezoelectric transformer by varying the driving frequency. An output current detector 70 detects output current IO; the driving frequency is varied by a frequency changer 80 in accordance with the detected voltage so as to drive the MOSFET 20, which functions as the main switch, via a driver 11. In the example illustrated, the piezoelectric transformer 50 is provided in parallel to the inductor 30; the same effect can be obtained when the piezoelectric transformer 50 is provided in parallel to the MOSFET 20. For the main switch, other switching device such as an N-channel MOSFET or a bipolar transistor than the P-channel MOSFET shown in the figure may be used to obtain the same effect.

Figure 18:
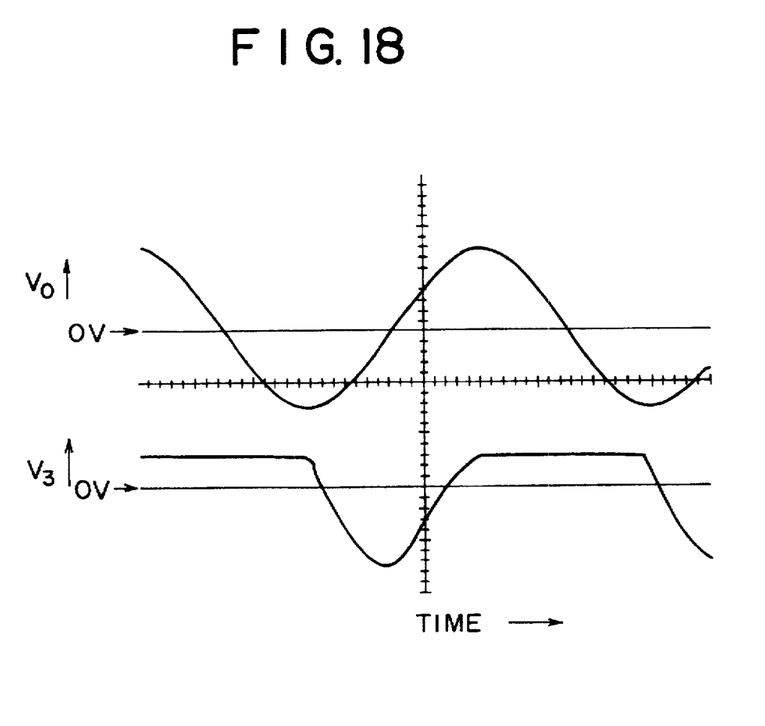
FIG. 18 is a waveform diagram showing the output voltage V0 and the exciting voltage V3 of the piezoelectric transformer of the circuit shown in FIG. 9.

FIG. 18 shows the waveforms of the output voltage V0 and the exciting voltage V3 of the piezoelectric transformer 50 of this embodiment. The exciting voltage V3 exhibits a distorted waveform of the exciting frequency which corresponds to the half wavelength mode of the piezoelectric transformer 50; it contains a high percentage of the second harmonic just as the one shown in FIG. 12. Nevertheless, the output voltage V0 exhibits an almost distortion-free waveform. This is because the piezoelectric transformer 50 is designed not to have the full wavelength mode and therefore, even if the exciting voltage V3 includes much second harmonic, which corresponds to the full wavelength mode, the piezoelectric transformer 50 vibrates only in the half wavelength mode and the output voltage V0 accordingly displays a sinusoidal wave. To be more strict, the exciting voltage V3 contains third harmonic and the piezoelectric transformer 50 works in a 3/2 wavelength mode which corresponds to the third harmonic; therefore, the output voltage V0 includes the third harmonic. The third harmonic contained in the exciting voltage V3, however, is only about 10% of the fundamental harmonic and the transformation by the piezoelectric transformer 50 in the 3/2 wavelength mode is extremely small. Accordingly, the third harmonic component contained in the output voltage V0 is small enough to ignore in practical applications.

[Fourth Embodiment]

Figure 10:
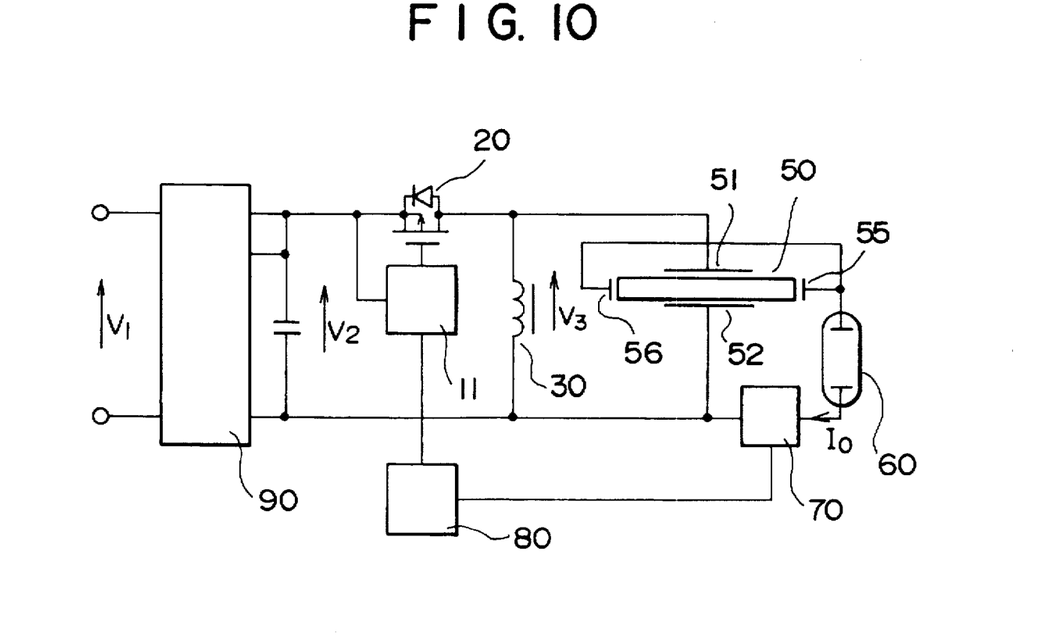
FIG. 10 is a circuit diagram showing an embodiment of a power converting circuit according to the invention in a case where the input voltage varies greatly.

FIG. 10 is a circuit diagram illustrative of an embodiment of the power converting device in a case where an input voltage V1 varies greatly. In the figure, a previous-stage voltage controller 90 regulates a voltage V2 supplied to an inverter. The previous-stage voltage controller 90 is adapted to control the supply voltage V2 to a predetermined voltage value by the step-down, step-up, or inverting chopper control or dropper control which is a publicly known art. The output currents are controlled by varying the frequency just like the case of the embodiment shown in FIG. 9.

Figure 16:
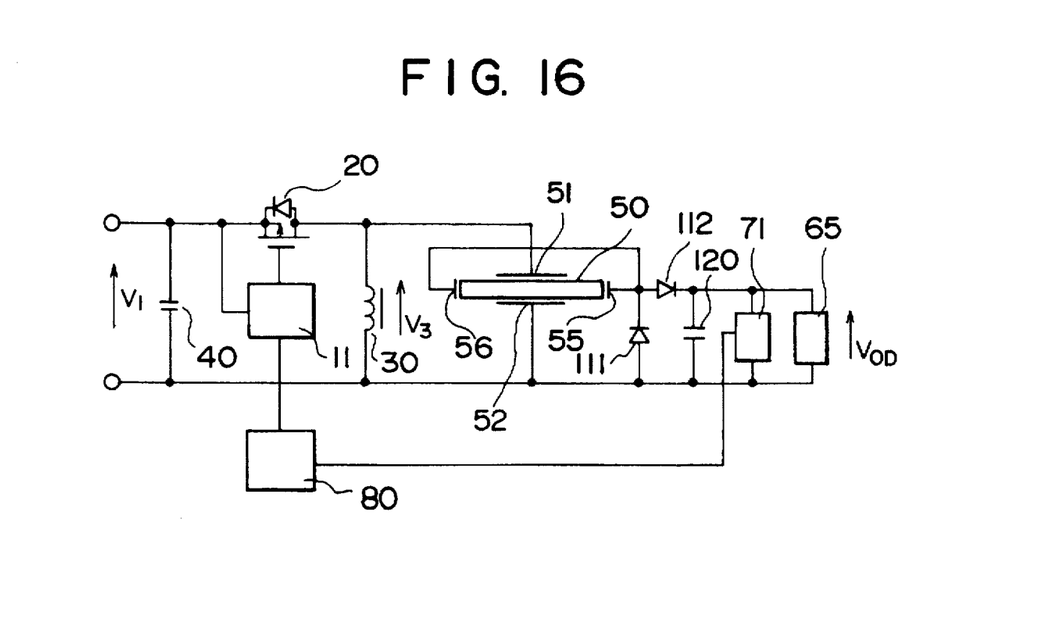
FIG. 16 is a circuit diagram showing an embodiment of another power converting circuit according to the invention which regulates the driving frequency to control the output.

The output control method described above can be applied also to a DC-DC converter which supplies DC voltage to electronic equipment. FIG. 16 is a circuit diagram showing an embodiment of a DC-DC converter in accordance with the present invention; the AC output of the piezoelectric transformer is converted into a DC output through rectifier diodes 111 and 112, and a smoothing capacitor 120. An output voltage detector 71 detects a DC output voltage V0D and the driving frequency is changed by the frequency changer 80 according to the detected voltage so as to drive the MOSFET 20, which serves as the main switch, via the driver 11.

According to the invention, the boosting ratio and efficiency in the half wavelength mode are higher than those obtained in the conventional piezoelectric transformer. Furthermore, since the piezoelectric transformer according to the invention is designed to provide no full wavelength mode, the output voltage waveform of the piezoelectric transformer is a sinusoidal wave of the exciting frequency which is free of distortion even if the exciting voltage of the frequency which corresponds to the half wavelength mode includes second harmonic.

The use of the laminated design for the driving section of the piezoelectric transformer makes it possible to drive a discharge tube such as a cold-cathode tube at high efficiency even from a low input voltage generator including a battery employed for portable electronic equipment.

Moreover, according to the invention, an inexpensive piezoelectric transformer element which provides a high boosting ratio and high efficiency and which is driven in a half wavelength mode with no full wavelength mode may be supplied.

The preferred embodiments described herein are illustrative and not restrictive, the scope of the invention being indicated by the appended claims and all variations which come within the meaning of the claims are intended to be embraced therein.

What I claim is:

1. A piezoelectric transformer comprising:

a long-plate-shaped piezoelectric element;

input electrodes coupled to the long-plate-shaped piezoelectric element;

output electrodes coupled to the long-plate-shaped piezoelectric element;

a driving section area of the long-plate-shaped piezoelectric element being polarized in the direction of thickness and including the input electrodes positioned at the central part of the piezoelectric element;

first and second power generating section areas including the output electrodes provided on end surfaces of said piezoelectric element in the direction of the length thereof, the first and second power generating sections being polarized in opposite directions from each other and disposed on opposite sides of said driving section area;

wherein said piezoelectric element is excited in a half wavelength mode to obtain an output between said output electrodes and said input electrodes and a ratio L2/L1 of a length L2 of said driving section area to an overall length L1 in the direction of the length of said piezoelectric element ranges from 0.3 to 0.6 and wherein a ratio L1/W of the overall length L1 to a width W of said piezoelectric element ranges from 4.10 to 4.77.

2. A piezoelectric transformer comprising:

a long-plate-shaped piezoelectric element;

input electrodes coupled to the long-plate-shaped piezoelectric element;

output electrodes coupled to the long-plate-shaped piezoelectric element;

a driving section area of the long-plate-shaped piezoelectric element being polarized in the direction of thickness and including the input electrodes positioned at the central part of the piezoelectric element;

first and second power generating section areas including the output electrodes provided on end surfaces of said piezoelectric element in the direction of the length thereof, the first and second power generating sections being polarized in opposite directions from each other and disposed on opposite sides of said driving section area;

wherein said piezoelectric element is excited in a half wavelength mode to obtain an output between said output electrodes and said input electrodes;

and wherein a ratio L2/L1 of a length L2 of said driving section area to an overall length L1 in the direction of the length of said piezoelectric element ranges from 0.3 to 0.6 and wherein said driving section area is comprised of said piezoelectric element and said input electrodes are alternately laminated and are connected with external electrodes at every other layer.

3. A power converting apparatus comprising:

a piezoelectric transformer described in one of claims 1 or 2;

inductance means constituting a resonance circuit with an input capacitance of said piezoelectric transformer;

switching means connected between a DC input power supply for supplying power to said piezoelectric transformer and said inductance means; and driving/oscillating means for generating a driving voltage of a predetermined frequency by the switching function of said switching means.

4. A power converting apparatus according to claim 3, further comprising a frequency changing section for controlling said driving/oscillating means.

5. A power converting apparatus according to claim 3, further comprising rectifying/smoothing means which is connected to the output of said piezoelectric transformer.

* * * * *